United States Patent
Tiberi et al.

(10) Patent No.: US 7,822,095 B2
(45) Date of Patent: Oct. 26, 2010

(54) VERTICAL CAVITY LASER FACEPLATE WITH DIFFRACTION GRATING

(75) Inventors: Michael D. Tiberi, Woodland Hills, CA (US); Vladimir I. Kozlovsky, Troitsk (RU)

(73) Assignee: Principia Lightworks, Inc., Woodland Hills, CA (US)

( * ) Notice: Subject to any disclaimer, the term of this patent is extended or adjusted under 35 U.S.C. 154(b) by 0 days.

(21) Appl. No.: 12/017,587

(22) Filed: Jan. 22, 2008

(65) Prior Publication Data

US 2008/0175289 A1 Jul. 24, 2008

Related U.S. Application Data

(60) Provisional application No. 60/886,092, filed on Jan. 22, 2007.

(51) Int. Cl.
*H01S 3/08* (2006.01)
(52) U.S. Cl. .................. 372/102; 372/70; 372/75; 372/99
(58) Field of Classification Search .......... 372/44.01, 372/50.1, 50.11, 50.124, 50.22, 70–75, 98, 372/99, 102
See application file for complete search history.

(56) References Cited

U.S. PATENT DOCUMENTS 5,461,637 A * 10/1995 Mooradian et al. ............ 372/92

| | | | |
|---|---|---|---|
| 2003/0151348 A1* | 8/2003 | Tiberi ............... | 313/461 |
| 2005/0135453 A1* | 6/2005 | Kneissl et al. ........ | 372/94 |
| 2006/0163998 A1* | 7/2006 | Tiberi et al. .......... | 313/477 R |
| 2006/0227833 A1* | 10/2006 | O'Daniel et al. ....... | 372/50.1 |
| 2007/0230543 A1* | 10/2007 | Erlandson et al. ...... | 372/102 |

OTHER PUBLICATIONS

International Search Report and Written Opinion in counterpart PCT application No. PCT/US08/51621, dated Jul. 8, 2008.

* cited by examiner

*Primary Examiner*—Minsun Harvey
*Assistant Examiner*—Xnning Niu
(74) *Attorney, Agent, or Firm*—Chen Yoshimura LLP

(57) ABSTRACT

A laser having a laser cavity is disclosed that does not require conventional dielectric mirrors or as-grown reflectors. Instead, a diffraction grating and total internal reflection system is used to define a laser cavity. Within the laser cavity, the laser emission travels in a zigzag pattern. The diffraction grating provides a highly reflective "mirror" diffracting beams at a forward angle and back angle that "tunes" the process of total internal reflection. The diffraction grating also directs a small percentage of the incident radiation approximately normal to the upper face of the semiconductor (more generally, at an angle less than the critical angle), to provide an output laser beam. The laser can be used in an electron tube and laser display system.

18 Claims, 4 Drawing Sheets

VERTICAL CAVITY LASER FACEPLATE WITH DIFFRACTION GRATING

This application claims priority from U.S. Provisional Patent Application No. 60/886,092, filed Jan. 22, 2007, which is herein incorporated by reference in its entirety.

BACKGROUND

1. Field of the Invention

The present invention generally relates to electron beam pumped lasers, and particularly to electron beam pumped lasers such as those that provide a light source for projection television.

2. Description of Related Art

Electron beam-pumped vertical cavity surface emitting lasers, known as "eVCSELs," can be used for a variety of applications including but not limited to projection televisions and high-power laser-light sources. An eVCSEL requires an electron source that can include a vacuum tube and an electron gun or an array of field emitters. The electron source generates an electron beam that is deflected and focused by magnetic fields to impinge upon a desired location on a laser faceplate.

The faceplate of an eVCSEL includes a laser structure instead of the conventional phosphors; therefore the faceplate emits laser light in response to electron beam pumping.

More particularly, the faceplate of a typical eVCSEL comprises a laser structure of semiconductor materials that forms the gain medium, is sandwiched between a highly reflective mirror and a partially reflective mirror in which a scanning electron beam bombards either one of the reflective mirrors. These mirrors may include, for example, a conventional dielectric stack of quarter-wave alternating layers of $Al_2O_3$ and $TiO_2$ with or without a metal layer in order to achieve a partially and highly reflective mirror. These mirrors could also be made as part of a monolithic structure where the mirrors are deposited during the same process as the gain medium.

To provide a light source for proposed visual displays (and particularly for large screen displays for consumer and/or commercial use), one or more eVCSELs can generate and modulate red, green, and blue laser light beams, and the beams are combined to make a full-color image. More particularly, in a typical display system, one eVCSEL generates red light, another eVCSEL generates green light, and a third eVCSEL generates blue light. One embodiment of a light source for projection television is disclosed in U.S. Pat. No. 7,309,953, issued Dec. 18, 2007, and entitled "Electron Beam Pumped Laser Light Source for Projection Televisions," which is herein incorporated by reference in its entirety. Another light source is disclosed in U.S. patent application Ser. No. 10/981,075, filed Nov. 3, 2004, and published on May 26, 2005, as Publication No. US2005-0110386A, entitled "Laser Cathode Ray Tube," which is herein incorporated by reference in its entirety.

SUMMARY

A laser having a laser cavity is disclosed herein that does not require conventional dielectric mirrors or as-grown reflectors. Instead, a diffraction grating and total internal reflection system is used to define a laser cavity. Within the laser cavity, the laser emission travels in a zigzag pattern. The diffraction grating provides a highly reflective "mirror" diffracting beams at a forward angle and back angle that "tunes" the process of total internal reflection. The diffraction grating also directs a small percentage of the incident radiation approximately normal to the upper face of the semiconductor (more generally, at an angle less than the critical angle), to provide an output laser beam.

In one embodiment, the laser cavity is pumped by a pump source including an electron gun that supplies an electron beam, to create an electron beam pumped vertical cavity laser. In another embodiment, the pump source may be an optical source such as a GaN laser diode.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE INVENTION

Figure 1:
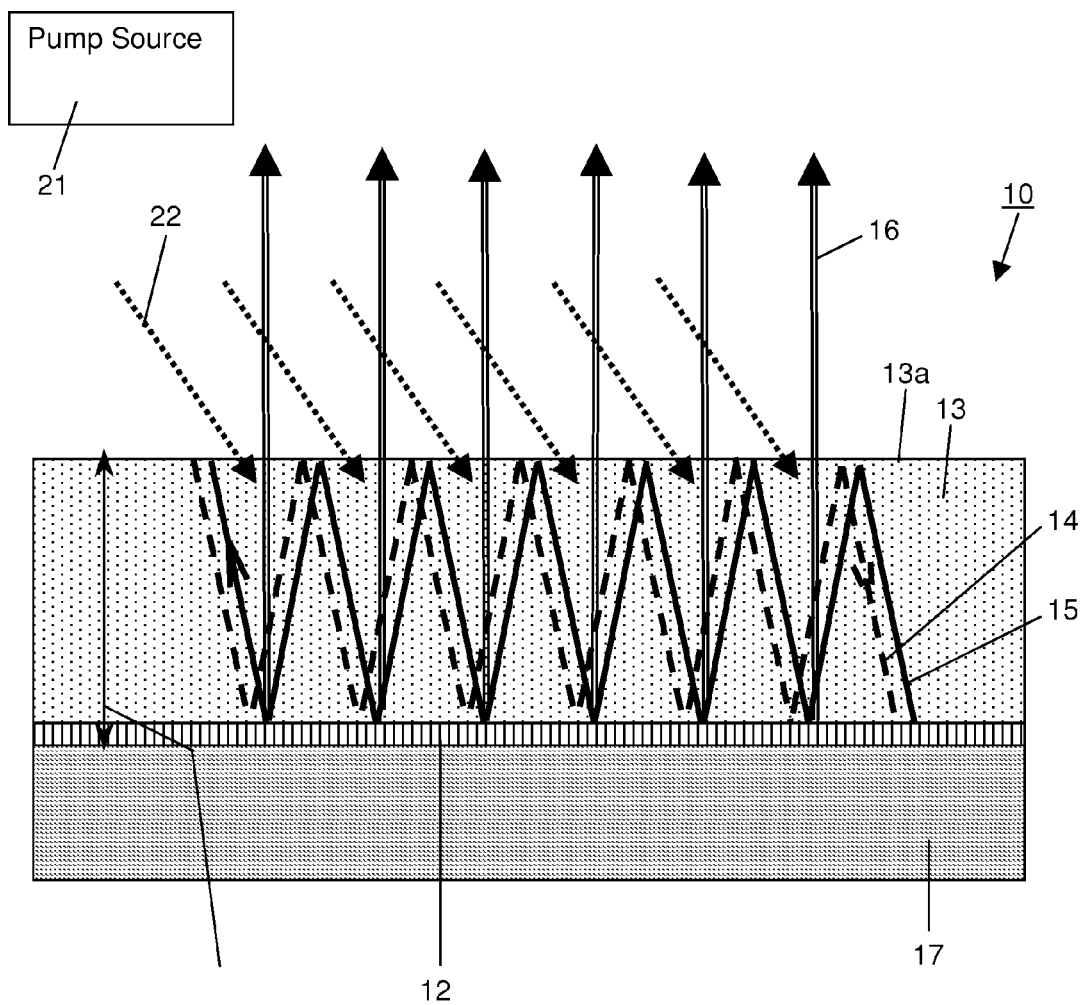
FIG. 1 is a side view of a faceplate, illustrating the laser cavity defined between the diffraction grating and the upper face of the semiconductor, and showing the zigzag pattern of the laser emission within the laser cavity including a rightward-traveling zigzag emission shown in dashed lines, a leftward-traveling zigzag emission shown in solid lines, and an output beam exiting in an upward direction.

FIG. 1 is a side view of a faceplate 10, illustrating a laser cavity 11 defined between a diffraction grating (or diffraction lattice) 12 and the upper face 13a of a semiconductor material 13, and showing the zigzag pattern of the laser emission within the laser cavity including a rightward-traveling zigzag emission 14 shown in dashed lines, a leftward-traveling zigzag emission 15 shown in solid lines, and an output beam 16 exiting in an upward direction. The laser cavity 11 is formed on a substrate 17 such as a metal substrate. FIG. 1 also shows a pump source 21 such as an electron beam source which generates an electron beam 22 impinging upon the laser faceplate 10.

Figure 2A:
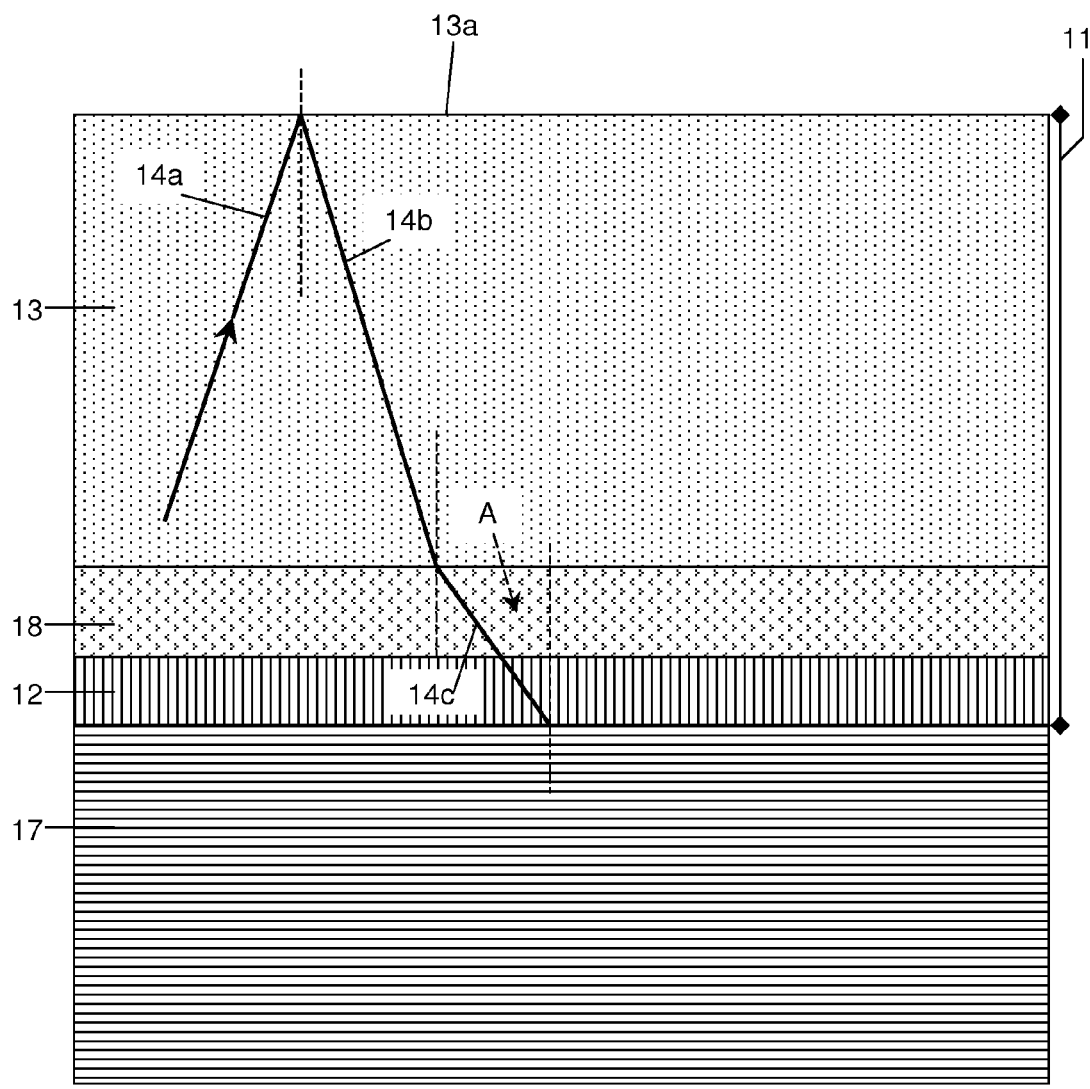
FIG. 2A is a side view of a laser faceplate showing (for purpose of illustration) a portion of the laser emission (an emission ray) within the laser cavity being totally internally reflected from the upper face, traveling through the semiconductor, then through a glue layer, and then impinging upon the diffraction grating.

FIG. 2A is a side view of the laser faceplate 10 showing (for purpose of illustration) a portion of the laser emission (an emission ray) 14a within the laser cavity 11 being totally internally reflected from the upper face 13a of the semiconductor 13, traveling through the semiconductor 13 (ray 14b), then through a glue layer 18 (ray 14c), and then impinging upon the diffraction grating 12. In other embodiments, the grating 12 may be formed on the semiconductor 13, and therefore in those embodiments the glue layer 18 would be between the grating and the substrate 17.

Figure 2B:
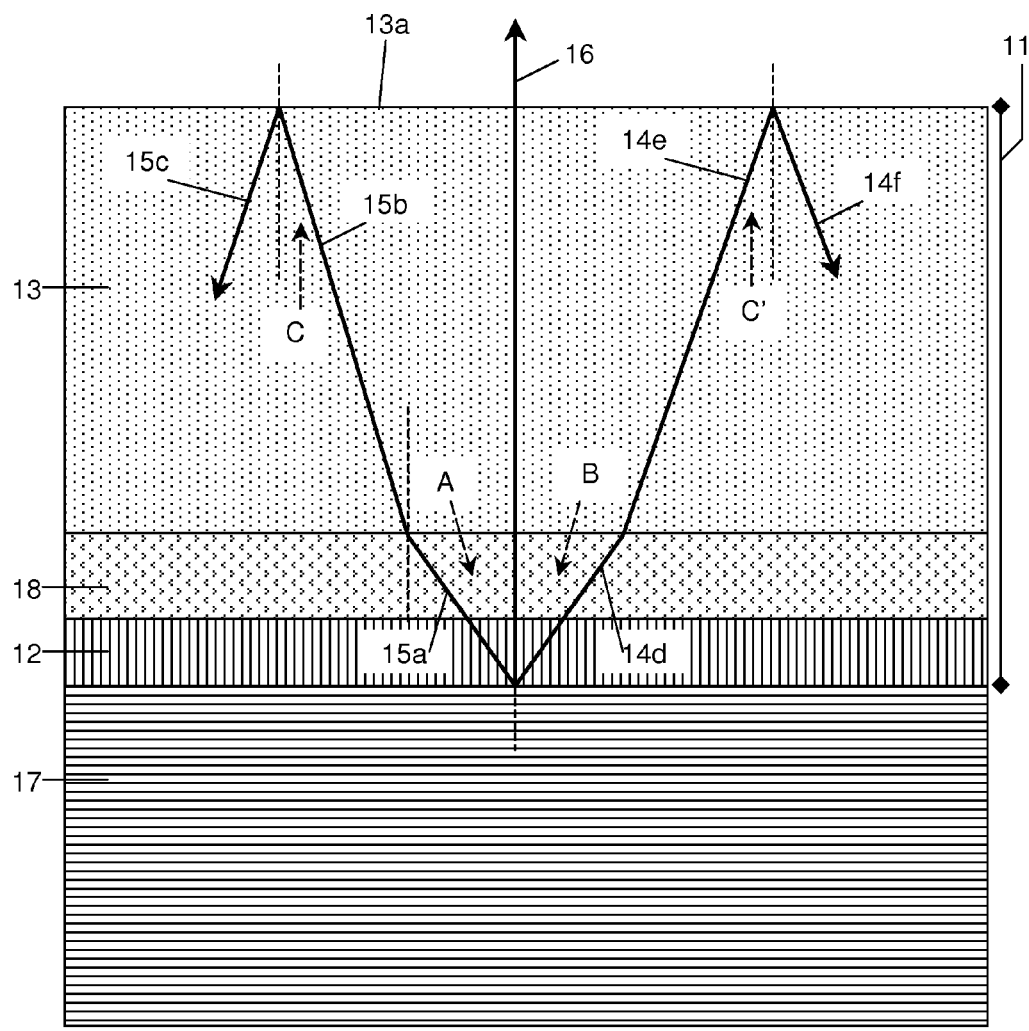
FIG. 2B is a side view of the faceplate of FIG. 2A, illustrating the resulting diffraction into a plurality of beams at different angles including a back angle, an output angle, and a forward angle.

FIG. 2B is a side view of the faceplate of FIG. 2A, illustrating the resulting diffraction into a plurality of beams at different angles including a back angle A, an output angle, and a forward angle B.

As shown in FIG. 1 and particularly in FIG. 2B, The internal light beam is divided into a number of beams (preferably three beams) at the point of reflection from the diffraction lattice 12: the first beam is the "back" beam 15a (which is diffracted back with a reflectivity of about 5-10% in this embodiment), the second beam is the forward, mirror-reflected beam 14d (with a reflectivity of about 90-95% in this embodiment), and the third beam is the output beam 16 (which is diffracted from the grating with reflectivity of about 2-5% in this embodiment). The third beam 16 (which provides the output beam) is diffracted approximately 90° to the surface normal of the diffraction grating 12. The first and second beams 15a and 14d are reflected from the surface at a non-normal angle large enough that they can be totally reflected from the top surface 13a due to total internal reflection (see rays 15b and 15c, and rays 14e and 14f, respectively). In other words, the first and second beams 15a and 14d have a surface reflection angle C and C', respectively, greater than the critical angle necessary to achieve total internal reflection from the upper surface 13a of the gain medium (the semiconductor 13).

The gain medium (semiconductor) 13 of an eVCSEL can comprise either bulk semiconductor materials such as CdS, ZnSe, ZnSSe, ZnO and others, or a multiple-quantum well structure including a plurality of wells and barriers that have the appropriate band gap for the desired output wavelength of the laser. For example, a multiple-quantum well structure consisting of ZnSSe wells and ZnMgSSe barriers will emit laser radiation in the blue spectral region. Materials can be selected from either the II-VI or III-V groups of the periodic table, for example.

The diffraction lattice or grating 12 is made on any suitable surface, for example it can be made on a metal substrate 17 with spacing appropriate for the output laser wavelength, or on the semiconductor 13. Further, the substrate 17 can be made of a transparent material such as glass or a sapphire window.

The term "phase diffraction lattice" means the phase grating. Diffraction gratings are of generally two types: phased and amplitude gratings. In a phased grating, different microareas of the phased grating change the phase of the reflected light beam, whereas in an amplitude grating, the micro-areas of the grating change amplitude of the reflected light beam. Typically a phase grating has a higher efficiency and therefore may be preferred for some embodiments.

In one embodiment (such as shown in FIGS. 2A and 2B), the diffraction grating 12 may be made on a surface of a metal substrate 17. In this process, periodic micro relief is prepared on the surface, and then coated to provide a highly reflective mirror (e.g., Al or Ag are two possible choices). The semiconductor 13 can then be connected to the grating 12, for example by gluing using a transparent epoxy (glue layer or adhesive layer 18).

Figure 3:
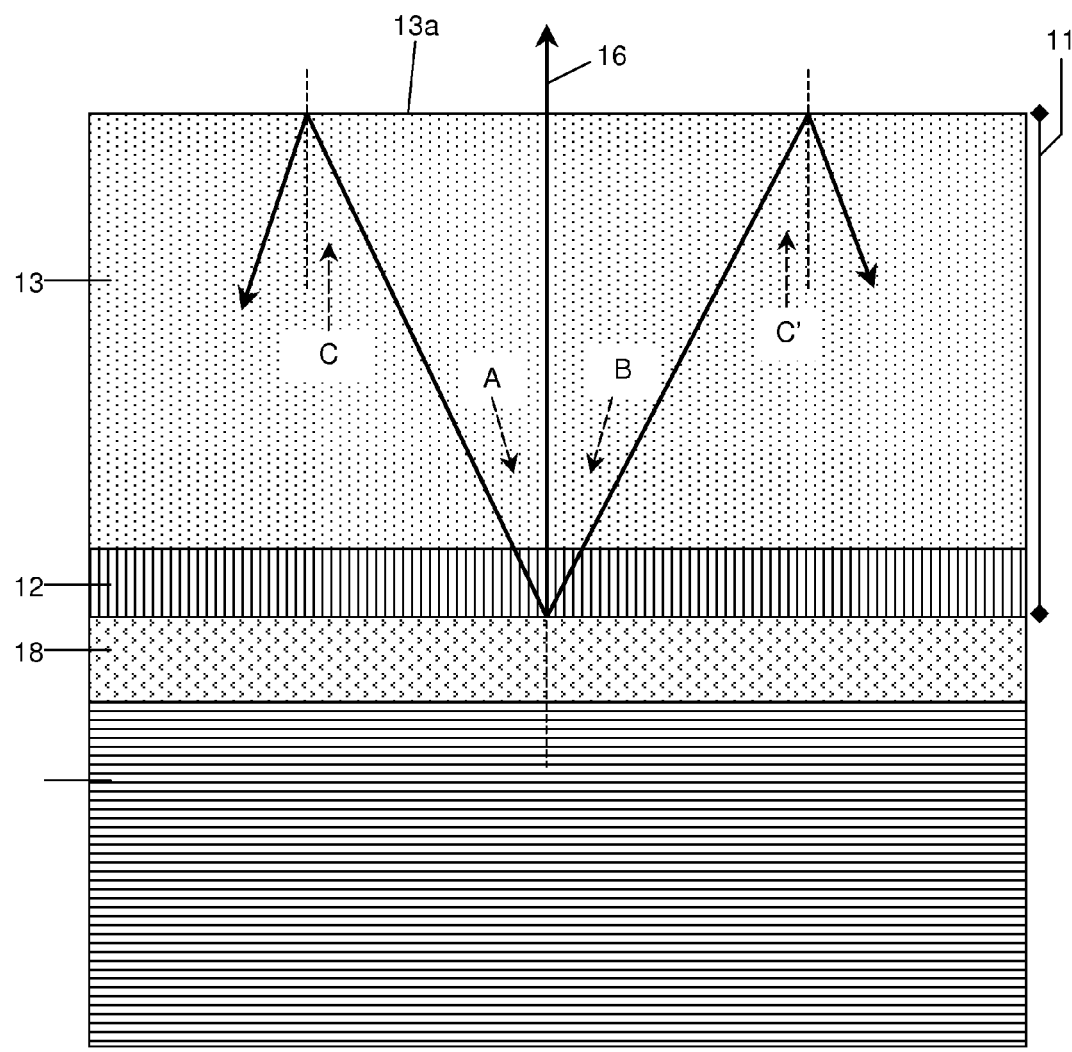
FIG. 3 is a side view of an alternative faceplate in which the diffraction grating is formed on the bottom of the semiconductor.

In another embodiment (such as shown in FIG. 3), the grating 12 is made directly on the surface of the semiconductor 13 by processes that may include relief and coating. Then the semiconductor 13 (with the grating 12) is connected to the substrate 17, for example by gluing with an electrically conductive epoxy (glue layer 18), or it may be connected by bonding with solder. In such an embodiment, the glue layer 18 is disposed between the grating 12 and the substrate 17.

Preferably the grating 12 has a flat surface in general, upon which periodic grooves (riffle) are formed. The condition of diffraction is:

$$d \cdot (\sin a - \sin b) = M \cdot \text{wavelength}/N$$

where d is the period of the grating, a is the angle between the incident beam and the surface normal, b is the angle between the diffracted beam and the surface normal, N is refractive index of the material before the grating surface (which is the glue layer 18 in FIG. 2B and the semiconductor 13 in FIG. 3), and M is an integer and represents the order of diffraction.

First take M=1 (the first order) for b=0 (b=0 corresponds to the output beam going along the surface normal) (e.g. ray 16 in FIG. 2B). Then d·sin a=wavelength/N and the condition of diffraction would also be valid for b=a (M=0) and for b=−a (M=2). b=a would correspond to the "mirror-reflected beam" (e.g. ray 14d in FIG. 2B) while b=−a would correspond to a "back beam" (i.e., a beam going in back angle direction) (e.g. ray 15a in FIG. 2B). There are other diffraction angles, such as those corresponding to M=−1 and M=3, for example. However the grating (to make special relief) may be designed in such a way that about 90-95% of incident light goes at angle b=a, about 5-10% goes at b=(−a), from 2% to 5% goes at B=0 and, less than 3% at other diffraction angles. The values may vary between embodiments, and may be dependent on the electron beam spot diameter. An appropriate diffraction grating can be designed by one skilled in the art, depending upon the implementation. In one embodiment, the value of a is about 20 degrees (sin a is about 0.4), the value of wavelength/N is about 0.2 um, and therefore d would be about 0.6 um. Such a pattern can be formed using lithography, for example.

It may be noted that the diffracted beams termed as "back" beams are a form of distributed feedback (DFB).

The angle of total internal reflection (the critical angle) for one embodiment of the semiconductor is about 18-20 degrees. The incident angle A is preferably greater than this critical angle. The light will then pass at different angles emitting from the semiconductor with the grating calculated for the angle A. Therefore the laser threshold for such light beams will be higher than for the beam at the angle A. For a semiconductor constructed of a multiple-quantum well (MQW), angle discrimination may be made even larger. For this purpose we need the MQW period equal to a value divisible by (wavelength/2N)/cos A instead of a value divisible by wavelength/2N as before. Then at angle A, the MQW structure will have higher gain and hence less threshold.

In other embodiments, the diffraction grating 12 may provide effective angle discrimination even for higher orders: for example M=2 or more may supply the output beam, which may be useful in the some particular cavity configurations.

EXAMPLE

In one example, the grating 12 is designed to function in a bulk semiconductor gain medium 13 of ZnSSe, which has a refractive index of 2.8. The light beam propagates through the semiconductor 13 with an angle to the grating surface of about 20 degrees from the surface normal. (20 degrees is around the critical angle at the interface from the semiconductor to air (n=1)). In one embodiment the glue layer 18 between the semiconductor 13 and the grating 12 has an index of refraction of 1.52 (N=1.52), and therefore the incident angle to the grating will be refracted at the semiconductor/glue interface to about 40 degrees; therefore the beam will be incident on the diffraction grating 12 at about 40 degrees. The diffraction grating 12 preferably creates three beams: about 85% of incident light power goes with the forward, mirror reflected beam, about 7% of the incident power goes with the back beam, and about 5% of the incident power goes with the beam passing along the normal (the output beam). About 3% of the incident power may be lost to grating losses or to losses from other diffracted beams.

SYSTEM EXAMPLE

The laser faceplate 10 can be implemented in an electron tube and laser display system such as disclosed in U.S. Pat. No. 7,309,953, issued Dec. 18, 2007, and entitled "Electron Beam Pumped Laser Light Source for Projection Televisions," which is herein incorporated by reference in its entirety.

Another electron tube and laser display implementation is disclosed in U.S. patent application Ser. No. 10/981,075, filed Nov. 3, 2004, and published on May 26, 2005, as Publication No. US2005-0110386A, entitled "Laser Cathode Ray Tube," which is herein incorporated by reference in its entirety.

Electron Beam Pumping

In some embodiments, the pump source comprises an electron gun that supplies an electron beam to the gain medium. The pumping angle shown in FIG. 1 is for purposes of illustration only, in other embodiments any suitable pumping angle can be utilized (e.g., 0°).

Optical Pumping

In other embodiments, the pump source comprises an optical source such as a laser diode (e.g., GaN) that supplies laser light at a suitable wavelength to pump the gain medium. The pumping angle shown in FIG. 1 is for purposes of illustration only, in other embodiments any suitable pumping angle can be utilized (e.g., 0°).

It will be apparent to those skilled in the art that various modification and variations can be made in the electron beam pumped lasers and related method of the present invention without departing from the spirit or scope of the invention. Thus, it is intended that the present invention cover modifications and variations that come within the scope of the appended claims and their equivalents.

What is claimed is:

1. A laser comprising:
   a pump source providing a pump beam; and
   a faceplate comprising:
   a semiconductor material that has two opposing faces including an upper face arranged to receive the pump beam and thereby pump the semiconductor material, and a second face situated opposite to the upper face; and
   a diffraction grating formed proximate to the second face that diffracts incident laser emission into a plurality of beams at a plurality of diffraction angles, including a forward beam, a back beam, and an output beam approximately normal to the upper face,
   wherein the diffraction grating and the upper face have a configuration that defines a zigzag laser cavity by total internal reflection of the forward and back beams from the upper surface.

2. The laser of claim 1, wherein the faceplate further comprises a substrate.

3. The laser of claim 2, wherein the diffraction grating is formed on the substrate, and
   wherein the faceplate further comprises an adhesive layer between the diffraction grating and the semiconductor material.

4. The laser of claim 3, wherein the grating includes periodic micro relief formed on a surface of the substrate and a coating over the micro relief forming a highly reflective mirror.

5. The laser of claim 3, wherein the adhesive is a transparent epoxy.

6. The laser of claim 2, wherein the diffraction grating is formed on the second face of the semiconductor material, and
   wherein the faceplate further comprises an adhesive between the substrate and the diffraction grating.

7. The laser of claim 6, wherein the grating includes periodic micro relief formed on a surface of the semiconductor material and a coating over the micro relief.

8. The laser of claim 6, wherein the adhesive is an electrically conductive epoxy.

9. The laser of claim 2, wherein the substrate is made of a metal.

10. The laser of claim 2, wherein the substrate is made of a transparent material.

11. The laser of claim 1, wherein the semiconductor material comprises CdS, ZnSe, ZnSSe, ZnO, or a multiple-quantum well structure.

12. The laser of claim 1, wherein the forward beam is diffracted with a reflectivity of approximately 90-95%, the back beam is diffracted with a reflectivity of approximately 5-10%, and the output beam is diffracted with a reflectivity of approximately 2-5%.

13. The laser of claim 1, wherein the pump source is an electron source providing a pump electron beam.

14. The laser of claim 1, wherein the pump source is a laser source providing a pump beam.

15. A method of generating laser energy in a laser, comprising:
   pumping a semiconductor material with a pump beam;
   in response to the pump beam, generating a zigzag laser emission within the semiconductor material, including reflecting the laser emission from a first face of the semiconductor material by total internal reflection, and diffracting the laser emission at a forward angle and a back angle from a diffraction grating located proximate to a second face of the semiconductor material; and
   diffracting a portion of the laser emission from the diffraction grating at an angle approximately normal to the first face to provide a laser output from the semiconductor material.

16. The method of claim 15, wherein the pump beam is a pump electron beam provided by an electron source.

17. The method of claim 15, wherein the pump source is a pump beam provided by a laser source.

18. The method of claim 15, wherein the laser emission diffracted at the forward angle is diffracted with a reflectivity of approximately 90-95%, the laser emission diffracted at the back angle is diffracted with a reflectivity of approximately 5-10%, and the portion of the laser emission diffracted at the angle approximately normal to the first face is diffracted with a reflectivity of approximately 2-5%.

\* \* \* \* \*